United States Patent
Ahbel et al.

(10) Patent No.: US 9,644,907 B1
(45) Date of Patent: May 9, 2017

(54) STRUCTURALLY DYNAMIC HEAT SINK

(71) Applicant: International Business Machines Corporation, Armonk, NY (US)

(72) Inventors: Bjorn J. Ahbel, Poughkeepsie, NY (US); Wiren D. Becker, Hyde Park, NY (US); Marc H. Coq, Hopewell Junction, NY (US); Milnes P. David, Poughkeepsie, NY (US); Ryan N. Elsasser, Poughkeepsie, NY (US); Syed F. Hossain, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/937,019

(22) Filed: Nov. 10, 2015

(51) Int. Cl.
| | |
|---|---|
| *G05D 23/00* | (2006.01) |
| *F28F 27/02* | (2006.01) |
| *F28F 13/08* | (2006.01) |
| *F28F 3/02* | (2006.01) |
| *F28D 21/00* | (2006.01) |

(52) U.S. Cl.
CPC ............. *F28F 27/02* (2013.01); *F28F 3/02* (2013.01); *F28F 13/08* (2013.01); *F28D 2021/0029* (2013.01); *F28F 2255/02* (2013.01)

(58) Field of Classification Search
CPC ......... H01L 35/32; H01L 35/34; H01L 35/30; H01L 23/33; H01L 23/467; F28F 3/02; F28F 2215/06; F28F 2255/02; F24F 11/0012; F24F 2011/005; F24F 13/00; F24F 13/08; F24F 1/10; F28D 2021/0028

USPC .......................................... 165/287, 288, 86
See application file for complete search history.

(56) References Cited

U.S. PATENT DOCUMENTS

| | | | |
|---|---|---|---|
| 6,026,895 A | 2/2000 | Moresco et al. | |
| 7,900,690 B2 | 3/2011 | Hawwa et al. | |
| 7,916,485 B2 * | 3/2011 | Yu ............................. | F28F 3/02 165/104.26 |
| 8,004,846 B2 | 8/2011 | Okada et al. | |
| 8,240,360 B2 * | 8/2012 | Bang ..................... | H01L 23/367 165/80.3 |

(Continued)

FOREIGN PATENT DOCUMENTS

| | | |
|---|---|---|
| EP | 2343736 A2 | 7/2011 |
| WO | 9939557 A1 | 8/1999 |

(Continued)

OTHER PUBLICATIONS

Ahbel et al., "Structurally Dynamic Heat Sink", U.S. Appl. No. 15/007,242, filed Jan. 27, 2016, pp. 1-20.

(Continued)

*Primary Examiner* — Justin Jonaitis
(74) *Attorney, Agent, or Firm* — Stephen R. Yoder; Fusheng Xu

(57) ABSTRACT

A heat sink structure is provided having fins mechanically altered dynamically to change and optimize the heat sink's performance based on certain environmental conditions. Specifically, the shape of fins of the heat sink structure is dynamically altered in response to environmental conditions that indicate the need for increased thermal performance by spreading the fins through a mechanical device dynamically, or by collapsing the fins to reduce pressure drop across a region when increased thermal performance is not needed.

14 Claims, 6 Drawing Sheets

(56) References Cited

U.S. PATENT DOCUMENTS

| | | | |
|---|---|---|---|
| 8,567,483 B2 | 10/2013 | Kamath et al. | |
| 9,105,809 B2 * | 8/2015 | Lofy | H01L 35/32 |
| 2002/0003691 A1 | 1/2002 | Eesley et al. | |
| 2002/0066550 A1 | 6/2002 | Tavassoli | |
| 2003/0196780 A1 * | 10/2003 | Hegde | H01L 23/367 |
| | | | 165/80.3 |
| 2004/0226695 A1 | 11/2004 | Bolle et al. | |
| 2009/0107657 A1 | 4/2009 | Montminy et al. | |
| 2009/0223648 A1 * | 9/2009 | Martin | F28F 1/40 |
| | | | 165/86 |
| 2010/0157537 A1 | 6/2010 | Yu et al. | |
| 2010/0157540 A1 * | 6/2010 | Yu | F28F 3/02 |
| | | | 361/710 |
| 2011/0038122 A1 | 2/2011 | Ahangar et al. | |
| 2011/0228478 A1 | 9/2011 | Takata et al. | |
| 2013/0063896 A1 | 3/2013 | Satou et al. | |
| 2013/0126145 A1 | 5/2013 | Glover et al. | |
| 2013/0138262 A1 | 5/2013 | Busch et al. | |

FOREIGN PATENT DOCUMENTS

| | | |
|---|---|---|
| WO | 2012067044 A1 | 5/2012 |
| WO | 2014178175 A1 | 11/2014 |

OTHER PUBLICATIONS

IBM Appendix P, list of patents and patent applications treated as related, Jan. 27, 2016, 2 pages.

Yang et al., "Numerical study of pin-fin heat sink with un-uniform fin height design", International Journal of Heat and Mass Transfer 51 (2008) 4788-4796, © 2008 Elsevier Ltd, doi:10.1016/j.ijheatmasstransfer.2008.02.017, 9 pages.

* cited by examiner

STRUCTURALLY DYNAMIC HEAT SINK

BACKGROUND

The present invention relates generally to the field of heat sinks, and more particularly to heat sinks for heat-generating electronic components.

A heat sink is a passive heat exchanger that removes heat generated by an electronic or a mechanical device, allowing the regulation of the device temperature. In computers, heat sinks are used to cool heat-generating electronic components, for example, central processing units (CPUs) or graphics processors. Generally, the temperature of the electronic component depends on the thermal resistance from the electronic component to the surrounding environment, and the heat dissipated by the electronic component. To prevent the electronic component from overheating, an efficient heat transfer path from the component to the surrounding environment may be desired, which may be from the component to a printed circuit board (PCB), to a heat sink, to air flow provided by a fan, and to the surrounding environment.

A heat sink is designed to maximize its surface area in contact with the cooling medium surrounding it, such as the air. Factors that affect the performance of a heat sink include air velocity, choice of material, protrusion design, surface treatment, and thermal interface materials. The shape of fins must be optimized to maximize heat transfer density and to minimize the pressure drop in the air flow across the heat sink. Many shapes exist ranging from elliptical and cylindrical cylinders, conical shapes to more sharpened surfaces. In general, the more surface area a heat sink has, the better its thermal performance is.

SUMMARY

According to an aspect of the present invention, a heat sink is provided comprising: a base plate having a first face to engage a heat-generating component and a second face; a plurality of fins supported on the second face of the base plate, wherein each fin of the plurality of fins is structured to define a channel having a first flexible wall and a second flexible wall; and a mechanism that alter the channel by reconfiguring the first flexible wall and the second flexible wall responsive to a change, wherein the mechanism is structurally coupled with the plurality of fins.

DETAILED DESCRIPTION

A heat sink structure has fins configured for mechanical alteration of their shape to modify heat sink performance according to certain environmental conditions. Specifically, the shape of fins of the heat sink structure is altered in response to environmental conditions that indicate the need for increased thermal performance, for example, by spreading the fins through a mechanical device, or by collapsing the fins to reduce pressure drop across a region (when maximum thermal performance is not needed and/or increased airflow is needed).

Some embodiments of the present invention include the following advantages: (i) orientation and shape of fins are adjustable to minimize pressure drop while maximizing thermal performance in all configurations (e.g., orientation of fins perpendicular to and vertical in airflow); (ii) an ability is provided to actuate fins actively in anticipation of temperature increase; (iii) the heat sink structure is configured to allow a single or multiple material fin(s) to be used to splay fins mechanically during thermal expansion; (iv) a method is provided to control air flow in a computer system; (v) air flow can be increased in a computer cooling system without the need to increase the fan speed; and/or (vi) more headroom is supplied when the computer system fans are maxed out (running at maximum speed).

The cooling of electronic components in a computer requires significant energy for fans to operate, and the operating fans create acoustical noise. Conventionally, fan speeds are set depending on the amount of cooling required and the electronic components are acoustically insulated to suppress the noise. The heat sink is generally designed based on maximum ambient temperature and maximum power usage of the electronic components. Therefore, one challenge is to minimize cooling energy and acoustical noise. As mentioned above, some embodiments of the present invention allow for optimizing pressure drop across the heat sink and thermal performance based on current and varying operating conditions.

Figure 1A:
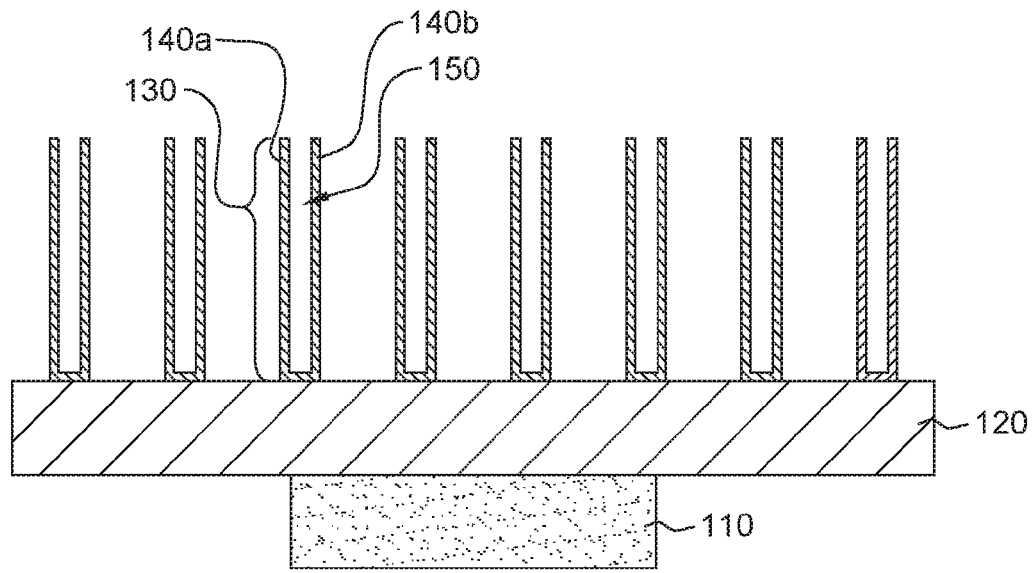
FIG. 1A is an orthographic side view of a first embodiment of a heat sink structure according to the present invention.

FIG. 1A is an orthographic side view of a first embodiment of a heat sink structure according to the present invention. The heat sink structure in FIG. 1A includes a heat sink base plate 120 having a first face and a second face, a heat-generating electronic component 110 coupled with the first face of the base plate 120, and a plurality of fins supported on the second face of the base plate 120. Each fin of the plurality of fins is structured to define a channel 150 having a first flexible wall 140a and a second flexible wall 140b. The heat sink structure may be made of aluminum alloy, copper, composite materials, and/or combination thereof. Alternatively, some embodiments of the present invention include a thermally conductive material applied between the heat-generating electronic component 110 and the first face of the base plate to enhance the heat transfer from the heat-generating electronic component to the heat sink. Such thermally conductive material includes, but not limited to, thermally conductive tape and epoxy.

Figure 1B:
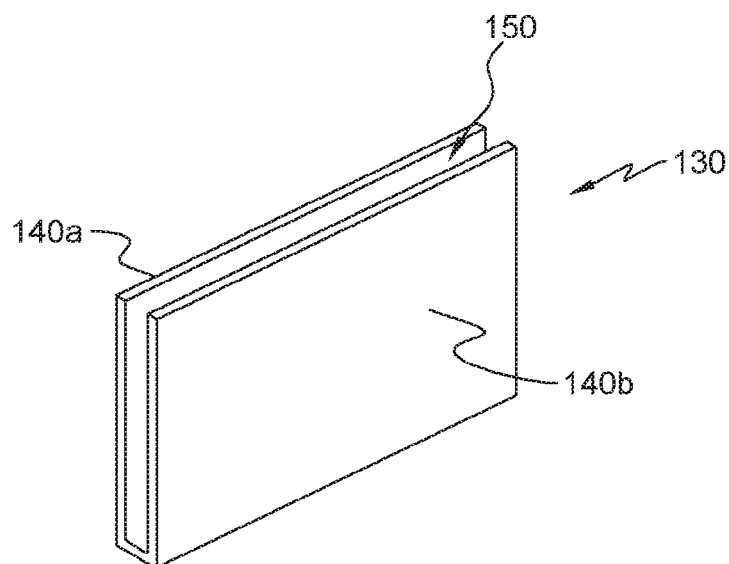
FIG. 1B is a perspective view of a single fin of the heat sink structure of the first embodiment in FIG. 1A.

FIG. 1B is a perspective view of a single fin of the heat sink structure of the first embodiment in FIG. 1A. The single fin 130, as shown in FIG. 1B, includes two walls 140a and 140b to form the channel 150 that may be any shape depending the two walls 140a and 140b. In this example, the channel 150 is in a rectangular shape with the two side walls 140a and 140b being parallel to each other. Additionally, the two side walls 140a and 140b are vertically joined to a bottom plate that is joined to the second face of the base plate 120. The joining of the bottom plate to the second face of the base plate 120 may be soldering or any other suitable joining form.

Environmental conditions at which a heat sink works may change. Such environmental conditions may be a temperature or a cooling requirement including a fan speed (for example, the rotational speed of the fan propeller). With a fixed fin shape, air flow to cool downstream electronic components may be reduced, and heat sink thermal impedance may be high. In addition, air-blowing fan speed is required to increase in order to meet high cooling demand, that impact acoustics and energy consumption.

Some embodiments of the present invention provide a mechanism that alter the channel by reconfiguring the first flexible wall 140a and the second flexible wall 140b responsive to a change to environmental conditions, wherein the mechanism is structurally coupled with the plurality of fins 130.

Figure 2A:
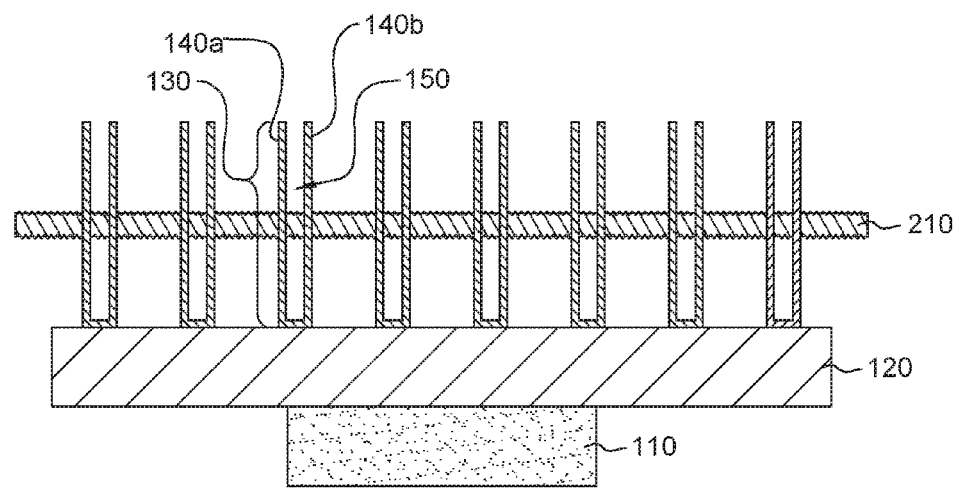
FIG. 2A is an orthographic side view of a second embodiment of a heat sink structure according to the present invention; the heat sink structure includes a first threaded or similarly actuating device and is not yet altered by the first threaded or similarly actuating device.

FIG. 2A is an orthographic side view of a second embodiment of a heat sink structure according to the present invention, wherein the heat sink structure includes a first threaded or similarly actuating device and is not yet altered by the first threaded or similarly actuating device. In this example, the mechanism is a first device including a first threaded or similarly actuating rod 210 that is coupled with the plurality of fins 130. The plurality of fins are constrained at their bottom plates only.

Figure 2B:
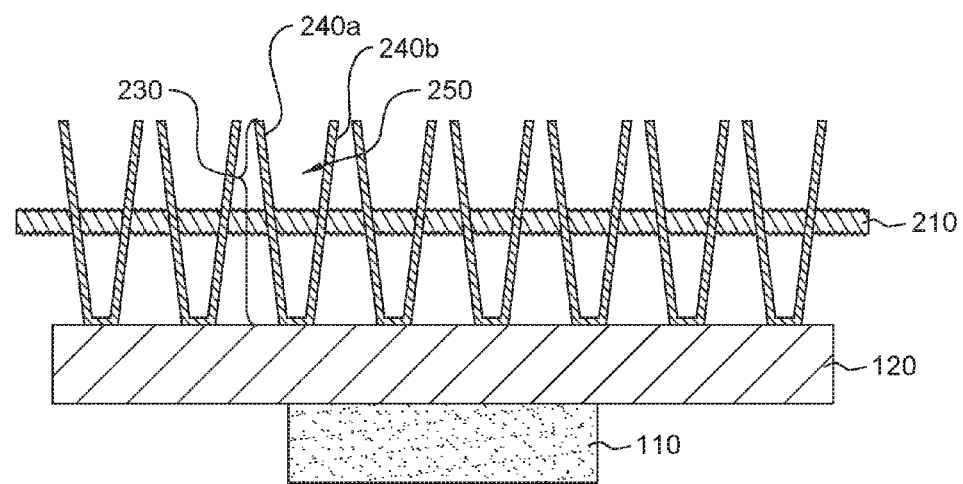
FIG. 2B is an orthographic side view of the second embodiment of the heat sink structure according to the present invention; the heat sink structure is altered by the first threaded or similarly actuating device.

FIG. 2B is an orthographic side view of the second embodiment of the heat sink structure according to the present invention, wherein the heat sin structure is altered by the first threaded or similarly actuating device. In this example, the plurality of fins are spread wider by rotating the first threaded or similarly actuating rod 210, for example, clockwise manually. Due to the constraint of the bottom plates of the plurality of fins, a v-shaped channel 250 is created for each of a plurality of altered fins 230 with spread walls 240a and 240b. Further, the first threaded or similarly actuating device includes a first drive member/device to drive the first threaded or similarly actuating rod to splay the plurality of fins 130. Further, a set of sensors may be included to sense a change to the environmental conditions, such as a temperature sensor and/or a fan speed sensor. Upon detecting a change to the environmental conditions, a signal is transmitted to the first drive member to activate the first threaded or similarly actuating rod 20 to alter the shape of the plurality of fins 130. The temperature sensor may sense a temperature of the heat-generating component 110, the plurality of fins 130, the base plate 120, and/or ambience.

Figure 3A:
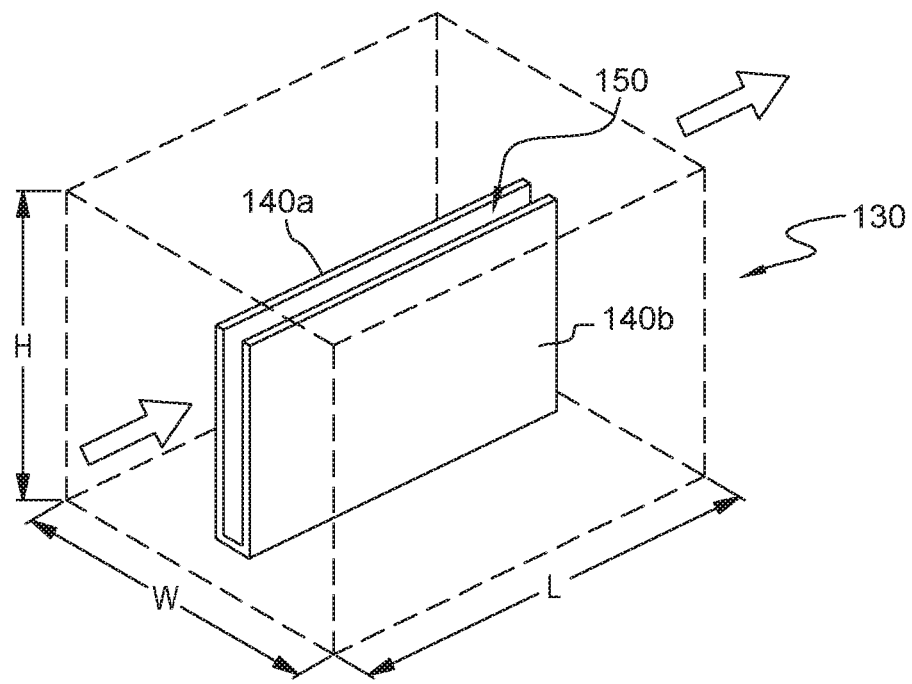
FIG. 3A is an perspective view of a diagram for numerical simulation of a single fin of the heat sink structure in FIG. 2A according to the present invention; the single fin is not yet altered by the first threaded or similarly actuating device.

FIG. 3A is a perspective view of a diagram for numerical simulation of a single fin of the heat sink structure in FIG. 2A according to the present invention, wherein the single fin is not yet altered by the first threaded or similarly actuating device. For computational and/or numerical simulation, the dotted line enclosure in FIG. 3A denotes the modeling boundary, and H, W, and L represent the height, the width, and the length of the enclosure respectively. In this example, an air flow enters (i.e., air flow inlet) the enclosure from the left side of the enclosure as shown by a first double edged arrow, and leave (i.e., air flow outlet) the enclosure from the right side of the enclosure as shown by a second double edged arrow.

Figure 3B:
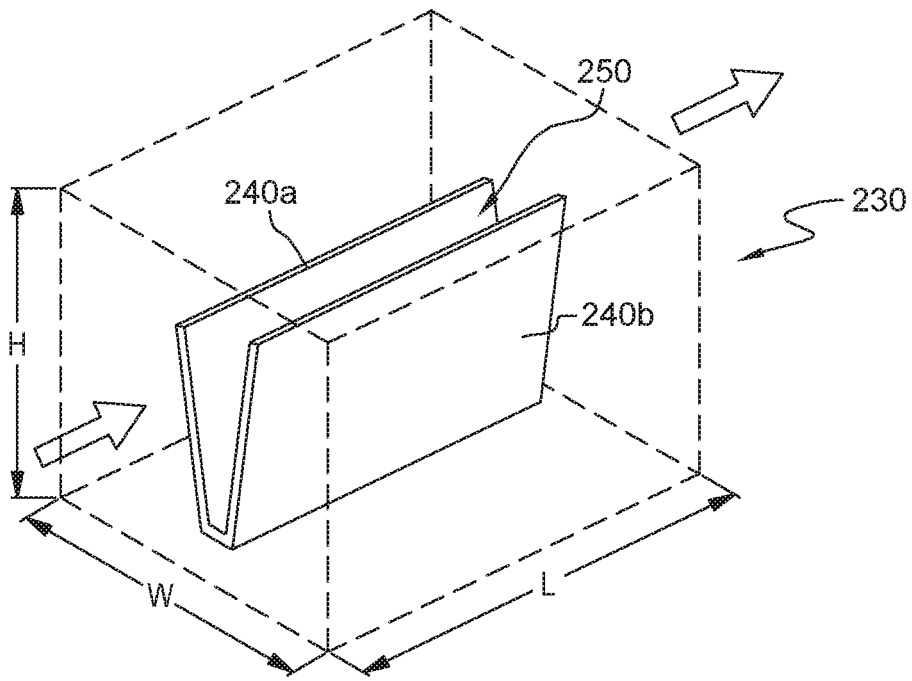
FIG. 3B is an perspective view of a diagram for numerical simulation of a single fin of the heat sink structure in FIG. 2B according to the present invention; the single fin is altered by the first threaded or similarly actuating device.

Computational simulation of the altered fin 230 is shown in FIG. 3B which is a perspective view of a diagram for numerical simulation of a single fin of the heat sink structure in FIG. 2B according to the present invention, wherein the single fin 230 is altered by the first threaded or similarly actuating device. After alteration, a v-shaped channel 250 is created by walls 240a and 240b. The dotted line enclosure in FIG. 3B denotes the modeling boundary as the same in FIG. 3A, and H, W, and L represent the height, the width, and the length of the enclosure respectively. As same in FIG. 3A, the air flow enters (i.e., air flow inlet) the enclosure from the left side of the enclosure as shown by a first double edged arrow, and leave (i.e., air flow outlet) the enclosure from the right side of the enclosure as shown by a second double edged arrow.

A result of numerical simulation as shown in FIGS. 3A and 3B is shown in Table 1. The "closed position" in Table 1 refers to a position in FIG. 2A where the first threaded or similarly actuating device does not alter the plurality of fins 130, and accordingly corresponds to the fin shape in FIG. 3A; the "open position" in Table 1 refers to a position in FIG. 2B where the first threaded or similarly actuating device alters the plurality of fins 130, and accordingly corresponds to the fin shape in FIG. 3B. The "Average Temp on Bottom Face of Heat Sink" refers to an average temperature on the first face of base plate 120 that is coupled with the heat-generating component 110. The "Average Pressure drop" refers to a pressure drop of air flow across the fin channels 150, 250, respectively. The "Delta" refers to a difference of a quantity (i.e., average temperature and average pressure drop in this example) between the "closed position" and the "open position". As shown in Table 1, average temperature on bottom face of heat sink at "open position" (after alteration) is about 1.66° C. lower than at "closed position" (prior to alteration), whereas the average pressure drop increases about 0.21 N/m² at "open position" (after alteration) compared to "closed position" (prior to alteration).

TABLE 1

A result of numerical simulation for a single fin as shown in FIGS. 3A and 3B.

| | Average Temperature on Bottom Face of Heat Sink (° C.) | Average Pressure Drop (N/m²) |
|---|---|---|
| CLOSED POSITION | 64.08 | 6.65 |
| OPEN POSITION | 62.42 | 7.47 |

TABLE 1-continued

A result of numerical simulation for a single fin as shown in FIGS. 3A and 3B.

| | Average Temperature on Bottom Face of Heat Sink (° C.) | Average Pressure Drop (N/m²) |
|---|---|---|
| DELTA | 1.66 | 0.21 |

Figure 4:
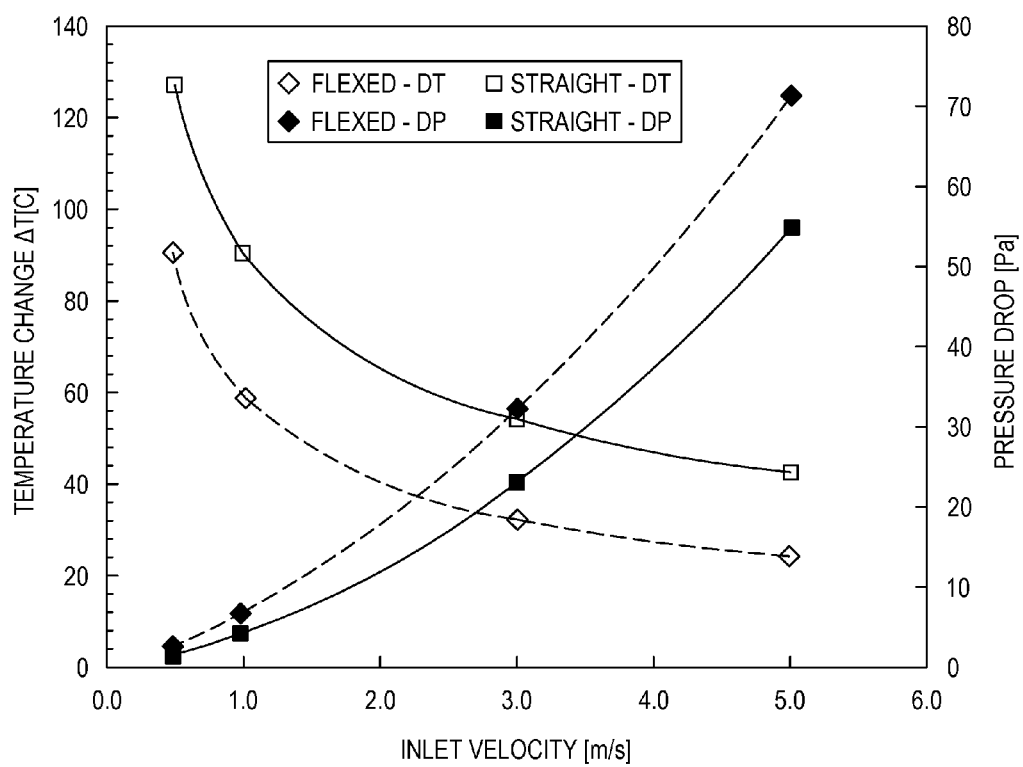
FIG. 4 is a diagram showing numerical simulated results of temperature change and air flow pressure drop according to the present invention.

FIG. 4 is a diagram showing further numerical simulated results of temperature change and air flow press drop according to the present invention. In FIG. 4, "DT" and "DP" refer to delta temperature (temperature difference) and delta pressure (pressure drop); "flexed" and "straight" refers to fin shape after alteration and fin shape prior to alteration, respectively. As seen from FIG. 4, delta temperature decreases with the increase of air flow inlet velocity (horizontal ordinate) whereas pressure drop increases with the increase of air flow inlet velocity.

Figure 5A:
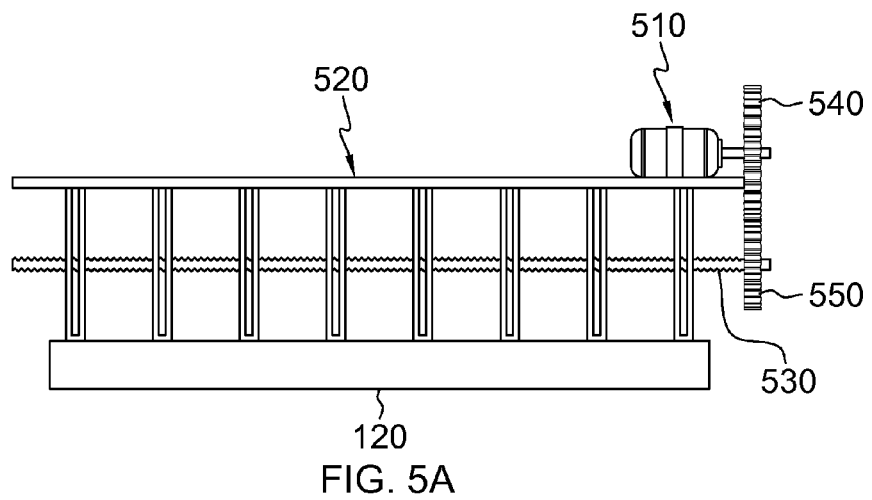
FIG. 5A is an orthographic side view of a third embodiment of a heat sink structure according to the present invention; the heat sink structure includes a second threaded or similarly actuating device and is not yet altered by the second threaded or similarly actuating device.

FIG. 5A is an orthographic side view of a third embodiment of a heat sink structure according to the present invention, wherein the heat sink structure includes a second threaded or similarly actuating device and is not yet altered by the second threaded or similarly actuating device. A second mechanism for altering the plurality of fins 130 according to a second embodiment of present invention refers to a second threaded or similarly actuating device including a drive device 510, a fixed rod/shaft 520, a threaded or similarly actuating rod/shaft 530, a driving gear 540; and a driven gear 550. The fixed rod 520 is coupled with top surfaces of the plurality of fins 130, and constrains top ends of the plurality of fins 130, thus the plurality of fins 130 are constrained at both top ends and bottom ends in this embodiment. The fixed rod 520 is also engaged with the drive device 510 that drives the driving gear 540. The driving gear 540 is engaged with the driven gear 550 that rotates the threaded or similarly actuating rod 530. The driving device further includes an electronic motor.

Figure 5B:
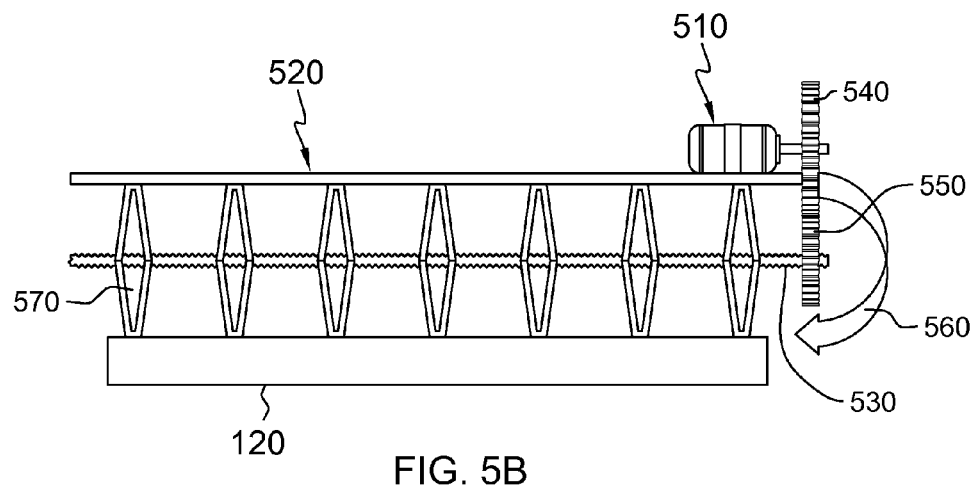
FIG. 5B is an orthographic side view of the third embodiment of the heat sink structure according to the present invention; the heat sink structure is altered by the second threaded or similarly actuating device.

FIG. 5B is an orthographic side view of the third embodiment of the heat sink structure according to the present invention, wherein the heat sink structure is altered by the second threaded rod or similarly actuating device. In this example, the plurality of fins 130 are altered by rotating the threaded or similarly actuating rod 530, for example, clockwise driven by the driven gear 550, as indicated by rotating direction arrow 560. Due to the constraint of both the bottom end and the top end of the plurality of fins, a flexed channel 570 is created for each of a plurality of altered fins with flexed walls. Further, a set of sensors may be included to sense a change to the environmental conditions, such as a temperature sensor and/or a fan speed sensor. Upon detecting a change to the environmental conditions, a signal is transmitted to the drive device 510 to activate the threaded or similarly actuating rod 530 to alter the shape of the plurality of fins 130. The temperature sensor may sense a temperature of the heat-generating component 110, the plurality of fins 130, the base plate 120, and/or ambience.

Figure 6A:
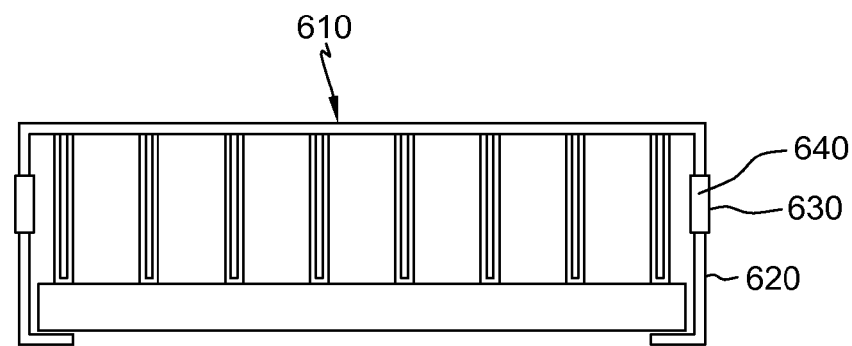
FIG. 6A is an orthographic side view of a fourth embodiment of a heat sink structure according to the present invention; the heat sink structure includes a compressed device and is not yet altered by the compressed device.

FIG. 6A is an orthographic side view of a fourth embodiment of a heat sink structure according to the present invention; the heat sink structure includes a compressed device and is not yet altered by the compressed device. Further, a third mechanism for altering the plurality of fins 130 according to a third embodiment of present invention refers to a compressed device including a compressing plate 610, engaging members 620, and a hydraulic, pneumatic or electronic device including a guiding sleeve 630 and a plunger 640. The compressing plate 610 is coupled with top surfaces of the plurality of fins 130, and constrains top ends of the plurality of fins 130, thus the plurality of fins 130 are constrained at both top ends and bottom ends in this embodiment. The compressing plate 610 is also engaged with the engaging members 620 that support the hydraulic, pneumatic, and/or electronic device. The hydraulic, pneumatic, and/or electronic device further includes a compressible fluid that fills the guiding sleeve 630. The hydraulic, pneumatic, and/or electronic device may further include a plunger locking member to lock the plunger upon a desirable compressing position is achieved. The hydraulic, pneumatic, and/or electronic device may further include a resistant component to return the plunger to its original position.

Figure 6B:
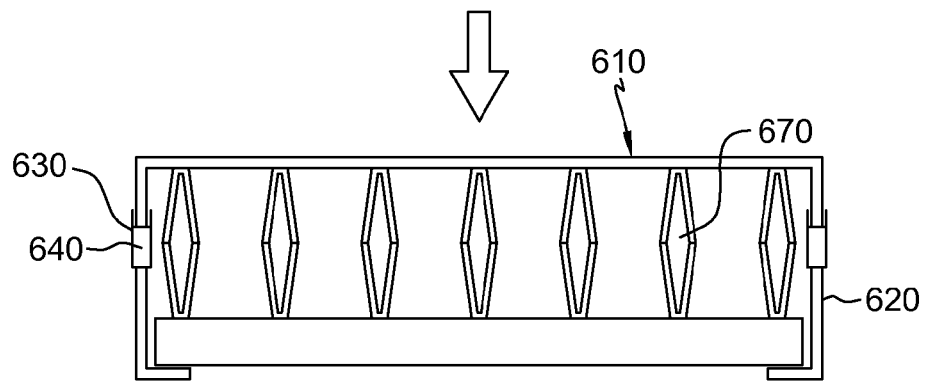
FIG. 6B is an orthographic side view of the third embodiment of the heat sink structure according to the present invention; the heat sink structure is altered by the compressed device.

FIG. 6B is an orthographic side view of the third embodiment of the heat sink structure according to the present invention, wherein the heat sink structure is altered by the compressed device. In this example, the plurality of fins 130 are altered by compressing the compressing plate 610, for example, by an external force applied manually or a force applying device (not shown), as indicated by downward direction arrow. Upon compressing of the compressing plate 610, the plunger 630 compresses the compressing fluid to move down in the guiding sleeve 640, causing the plurality of fins to change shape. Due to the constraint of both the bottom end and the top end of the plurality of fins 130, a flexed channel 670 is created for each of a plurality of altered fins with flexed walls. Further, a set of sensors may be included to sense a change to the environmental conditions, such as a temperature sensor and/or a fan speed sensor. Upon detecting a change to the environmental conditions, a signal is transmitted to the force applying device to activate the compressing plate 610 to alter the shape of the plurality of fins 130. The temperature sensor may sense a temperature of the heat-generating component 110, the plurality of fins 130, the base plate 120, and/or ambience.

Further, the plurality of fins 130 may be made of a single or plurality of materials with a high thermal expansion coefficient (TEC), such that the plurality of fins may change shape automatically upon a change to the environmental conditions.

The descriptions of the various embodiments of the present invention have been presented for purposes of illustration, but are not intended to be exhaustive or limited to the embodiments disclosed. Many modifications and variations will be apparent to those of ordinary skilled in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The following paragraphs set forth some definitions for certain words or terms for purposes of understanding and/or interpreting this document.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

And/or: inclusive or; for example, A, B "and/or" C means that at least one of A or B or C is true and applicable.

Mechanically connected: Includes both direct mechanical connections, and indirect mechanical connections made through intermediate components; includes rigid mechanical connections as well as mechanical connection that allows for relative motion between the mechanically connected components; includes, but is not limited, to welded connections, solder connections, connections by fasteners (for example, nails, bolts, screws, nuts, hook-and-loop fasteners, knots, rivets, quick-release connections, latches and/or magnetic connections), force fit connections, friction fit connections, connections secured by engagement caused by gravitational forces, pivoting or rotatable connections, and/or slidable mechanical connections.

What is claimed is:

1. A heat sink, comprising:
    a base plate having a first face to engage a heat-generating component and a second face;
    a fin supported on the second face of the base plate, the fin including a first flexible wall and a second flexible wall; the fin including a channel having a first cross-sectional shape defined, at least in part, by the first flexible wall and the second flexible wall; and
    a mechanism that alters the first cross-sectional shape of the channel to a second cross-sectional shape by reconfiguring the first flexible wall responsive to a change in temperature, the mechanism being structurally coupled with the fin;
    wherein:
    the mechanism includes a threaded device that is coupled with the fin.

2. The heat sink of claim 1, wherein the first flexible wall is parallel to the second flexible wall.

3. The heat sink of claim 1, wherein the fin is made of a material having a high coefficient of thermal expansion.

4. The heat sink of claim 1, wherein the mechanism includes a compressible device that is coupled with the fin.

5. The heat sink of claim 1, wherein the mechanism further includes a drive device to drive the threaded device.

6. The heat sink of claim 5, wherein the drive device includes an electric motor.

7. The heat sink claim 1, wherein the change in temperature is based on a temperature of a member selected from a group consisting of:
    the heat-generating component;
    the fin;
    the base plate; and
    a surrounding volume of air.

8. A method for modifying heat sink performance, the method comprising:
    determining a change in temperature; and
    responsive to determining the change, altering a channel of a fin of a heat sink, the heat sink having a base plate, the fin, and a mechanism, the base plate having a first face to engage a heat-generating component and a second face, the fin being supported on the second face of the base plate, the fin including a first flexible wall and a second flexible wall, the fin including the channel having a first cross-sectional shape defined, at least in part, by the first flexible wall and the second flexible wall, the mechanism being structurally coupled with the fin;
    wherein:
    the mechanism alters the channel of the fin by reconfiguring the first flexible wall; and
    the mechanism includes a threaded device that is coupled with the fin.

9. The method of claim 8, wherein the mechanism includes a compressible device that is coupled with the fin.

10. The method of claim 8, wherein the mechanism further includes a drive device to drive the threaded device.

11. The method of claim 10, wherein the drive device includes an electric motor.

12. The method of claim 8, wherein the change in temperature is based on a temperature of a member selected from a group consisting of:
    the heat-generating component;
    the fin;
    the base plate; and
    a surrounding volume of air.

13. The method of claim 8, wherein the first flexible wall is parallel to the second flexible wall.

14. The method of claim 8, wherein the fin is made of a material having a high coefficient of thermal expansion.

* * * * *